(12) United States Patent
Wakabayashi (10) Patent No.: US 11,248,296 B2
(45) Date of Patent: Feb. 15, 2022

(54) SOURCE GAS SUPPLY APPARATUS, FILM FORMING APPARATUS, AND SOURCE GAS SUPPLY METHOD

(71) Applicant: TOKYO ELECTRON LIMITED, Tokyo (JP)

(72) Inventor: Satoshi Wakabayashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 83 days.

(21) Appl. No.: 16/589,410

(22) Filed: Oct. 1, 2019

(65) Prior Publication Data

US 2020/0115801 A1 Apr. 16, 2020

(30) Foreign Application Priority Data

Oct. 12, 2018 (JP) .............................. JP2018-193767

(51) Int. Cl.
| | | |
|---|---|---|
| *C23C 16/44* | (2006.01) | |
| *C23C 16/52* | (2006.01) | |
| *C23C 16/448* | (2006.01) | |
| *H01L 21/205* | (2006.01) | |
| *H01L 21/02* | (2006.01) | |

(Continued)

(52) U.S. Cl.
CPC .............. *C23C 16/52* (2013.01); *B05B 12/00* (2013.01); *C23C 16/4481* (2013.01); *C23C 16/455* (2013.01); *H01L 21/0228* (2013.01); *H01L 21/0262* (2013.01); *H01L 21/205* (2013.01)

(58) Field of Classification Search
CPC .......... C23C 16/4402; C23C 16/45544; C23C 16/405; C23C 16/45578; C23C 16/448; C23C 16/52; C23C 16/4481; C23C 16/455; B01D 45/08; B01D 50/002; B05B 12/00; H01L 21/67017; H01L 21/205; H01L 21/0228; H01L 21/0262
USPC ..... 118/723 VE, 726, 663, 695; 156/345.29, 156/345.24

See application file for complete search history.

(56) References Cited

U.S. PATENT DOCUMENTS 6,296,711 B1 * 10/2001 Loan ....................... C23C 16/44
118/50
2004/0159005 A1 * 8/2004 Olander ............ H01L 21/67017
34/402

FOREIGN PATENT DOCUMENTS

| JP | 2003-268551 A | 9/2003 |
|---|---|---|
| JP | 2011-060789 A | 3/2011 |
| JP | 2016040402 A | 3/2016 |

(Continued)

*Primary Examiner* — Rudy Zervigon
(74) *Attorney, Agent, or Firm* — Nath, Goldberg & Meyer; Jerald L. Meyer; Tanya E. Harkins (57) ABSTRACT

A source gas supply apparatus that supplies a source gas into a processing container, includes: a raw material container configured to contain a raw material, and to vaporize the raw material; a source gas supply flow path configured to supply the source gas including the vaporized raw material into the processing container; a flow rate measurement part installed in the source gas supply flow path, and configured to measure a flow rate of the source gas; a diluent gas supply flow path joining a downstream side of the flow rate measurement part in the source gas supply flow path, and configured to supply a diluent gas for diluting the source gas; and a gas mixer provided at a merging portion of the source gas supply flow path and the diluent gas supply flow path, and configured to mix the source gas with the diluent gas via a Venturi effect.

9 Claims, 8 Drawing Sheets

(51) Int. Cl.
*C23C 16/455* (2006.01)
*B05B 12/00* (2018.01)

(56) References Cited

FOREIGN PATENT DOCUMENTS

| | | |
|---|---|---|
| KR | 1020100039850 A | 4/2010 |
| KR | 1020140118893 A | 10/2014 |
| KR | 1020160021717 A | 2/2016 |

\* cited by examiner

|  | Source Gas Supply Apparatus of Reference Example | Source Gas Supply Apparatus of Embodiment |
|---|---|---|
| Carrier Gas [sccm] | 1500 | 400 |
| Carrier Gas + Diluent Gas [sccm] | 4500 | 5600 |
| Vaporization Amount of Raw Material [sccm] | 30 | 30 |
| Full Scale of MFM [ccm] | 7000 | 500 |
| Ratio of Source Gas [%] | 0.4 | 6 |

FIG. 8

SOURCE GAS SUPPLY APPARATUS, FILM FORMING APPARATUS, AND SOURCE GAS SUPPLY METHOD

CROSS-REFERENCE TO RELATED APPLICATION

This application is based upon and claims the benefit of priority from Japanese Patent Application No. 2018-193767, filed on Oct. 12, 2018, the entire contents of which are incorporated herein by reference.

TECHNICAL FIELD

The present disclosure relates to a source gas supply apparatus, a film forming apparatus, and a source gas supply method.

BACKGROUND

There is known a source gas supply apparatus, which mixes a diluent gas with a source gas containing a carrier gas and a gas obtained by vaporizing a solid or liquid raw material and supplies the mixed gas into a processing container (see, for example, Patent Document 1). In this apparatus, the flow rate of the carrier gas is controlled based on the vaporization amount of the raw material obtained by subtracting the flow rate of the carrier gas from the flow rate of the source gas, and the flow rate of the diluent gas is controlled so as to make the total flow rate of the carrier gas and the diluent gas constant.

PRIOR ART DOCUMENT

Patent Document

Japanese Laid-Open Patent Publication No. 2016-40402

SUMMARY

According to one embodiment of the present disclosure, there is provided a source gas supply apparatus that supplies a source gas into a processing container, the source gas supply apparatus including: a raw material container configured to contain a solid or liquid raw material, and to vaporize the raw material; a source gas supply flow path configured to supply the source gas including the raw material vaporized in the raw material container into the processing container; a flow rate measurement part installed in the source gas supply flow path, and configured to measure a flow rate of the source gas; a diluent gas supply flow path joining a downstream side of the flow rate measurement part in the source gas supply flow path, and configured to supply a diluent gas for diluting the source gas; and a gas mixer provided at a merging portion of the source gas supply flow path and the diluent gas supply flow path, and configured to mix the source gas with the diluent gas via a Venturi effect.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In all the accompanying drawings, the same or corresponding members or components will be denoted by the same or corresponding reference numerals, and redundant descriptions will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Film Forming Apparatus]

Figure 1:
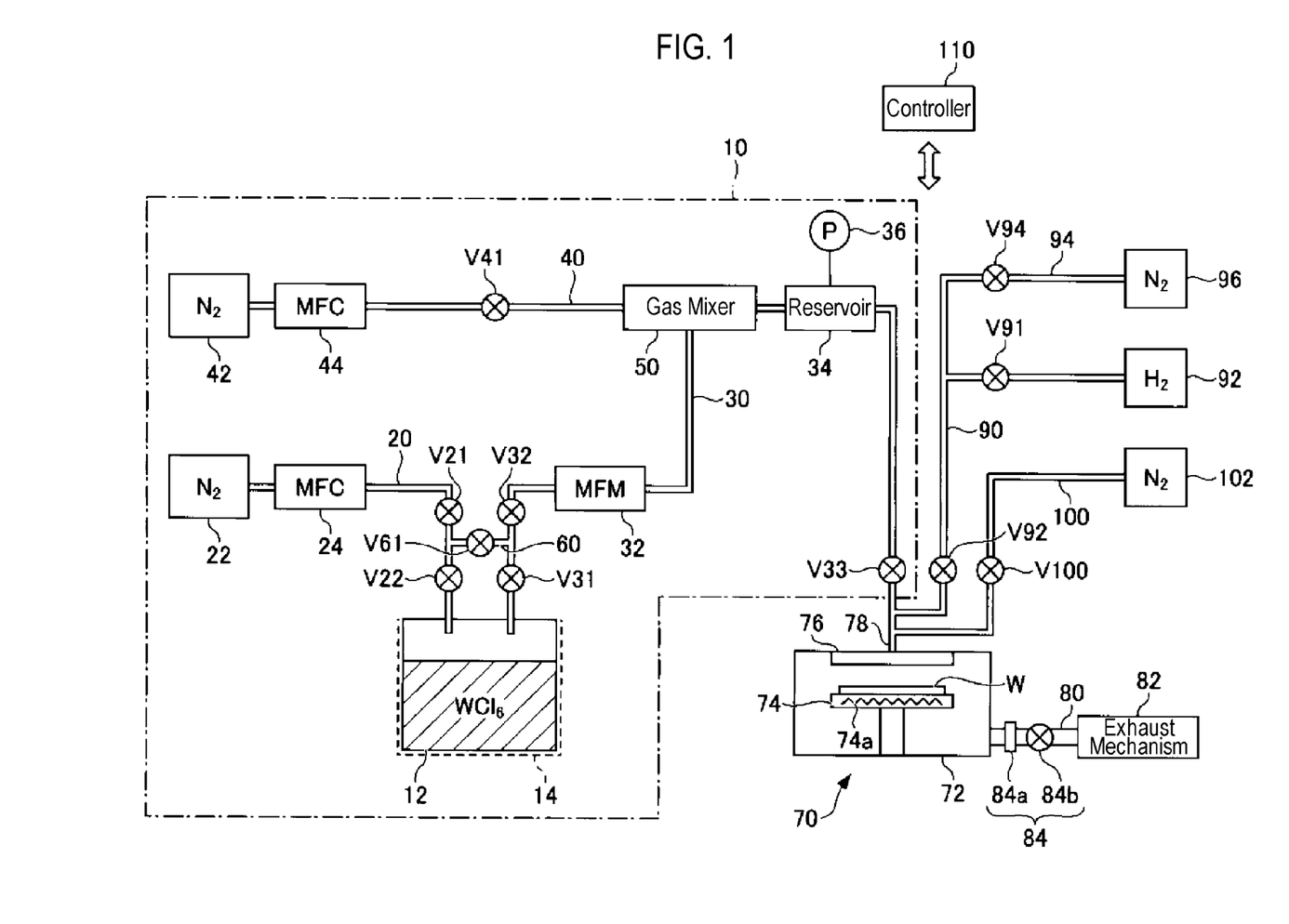
FIG. 1 is a view illustrating an exemplary configuration of a film forming apparatus including a source gas supply apparatus according to one embodiment of the present disclosure.

An exemplary configuration, in which a source gas supply apparatus of an embodiment is applied to a film forming apparatus, will be described. FIG. 1 is a view illustrating an exemplary configuration of a film forming apparatus including a source gas supply apparatus according to one embodiment of the present disclosure.

As illustrated in FIG. 1, the film forming apparatus includes a source gas supply apparatus 10, a film forming part 70, and a controller 110. The source gas supply apparatus 10 supplies a source gas to the film forming part 70. The film forming part 70 performs film formation on a wafer W, which is a substrate, through atomic layer deposition method (ALD method), chemical vapor deposition method (CVD method), or the like. The controller 110 controls the operation of each part of the source gas supply apparatus 10 and the film forming part 70. A gas obtained by mixing a carrier gas and a (vaporized) raw material that flows with the carrier gas will be referred to as a source gas.

The source gas supply apparatus 10 has a raw material container 12, which contains a raw material, which is solid or liquid at normal temperature. A heater 14 is provided around the raw material container 12. The heater 14 heats the raw material, which is solid or liquid in the raw material container 12, to a predetermined temperature to vaporize the raw material. In the embodiment, the raw material is a solid raw material, and is tungsten hexachloride ($WCl_6$). The raw material is not limited to $WCl_6$, and may be a low vapor pressure raw material, for example, tungsten pentachloride ($WCl_5$), molybdenum pentachloride ($MoCl_5$), zirconium tetrachloride ($ZrCl_4$), tantalum pentachloride ($TaCl_5$), or triruthenium dodecacarbonyl ($Ru_3(CO)_{12}$).

A downstream end of a carrier gas supply flow path 20 and an upstream end of a source gas supply flow path 30 are inserted into the raw material container 12. In an upstream end of the carrier gas supply flow path 20, a carrier gas supply source 22 as a supply source of the carrier gas is installed. The carrier gas may be, for example, an inert gas such as a nitrogen ($N_2$) gas. In the carrier gas supply flow path 20, a mass flow controller (MFC) 24, a valve V21, and a valve V22 are provided in this order from the upstream side thereof. The MFC 24 controls the flow rate of the carrier gas flowing through the carrier gas supply flow path 20.

In the source gas supply flow path 30, a valve V31, a valve V32, a mass flow meter (MFM) 32, which is a flow rate measurement part, a buffer tank 34, which is a reservoir, and a valve V33 are provided in this order from the upstream side thereof. The MFM 32 measures the flow rate of the source gas flowing through the source gas supply flow path 30. The buffer tank 34 temporarily stores the source gas, and supplies the necessary source gas in a short time. The valve V33 is a valve for switching the supply and stop of the gas during ALD, and is, for example, an ALD valve, which is opened and closed at high speed. It is preferable that the ALD valve be opened and closed at an interval of equal to or less than 0.5 sec, and it is further preferable that the ALD valve be opened and closed at an interval of equal to or less than 0.01 sec. The buffer tank 34 is provided with a pressure gauge 36 that measures the pressure of the gas therein. The pressure gauge 36 may be, for example, a capacitance manometer. A vicinity of a downstream end of the source gas supply flow path 30 is illustrated as a gas supply flow path 78 because a reaction gas and a purge gas to be described later also flow therethrough.

A downstream end of a diluent gas supply flow path 40, which supplies a diluent gas, joins a downstream side of the MFM 32 in the source gas supply flow path 30. In an upstream end of the diluent gas supply flow path 40, a diluent gas supply source 42 as a supply source of the diluent gas is installed. The diluent gas may be, for example, an inert gas such as $N_2$ gas. The diluent gas is also referred to as an offset gas. In the diluent gas supply flow path 40, a mass flow controller (MFC) 44 and a valve V41 are provided in this order from the upstream side thereof.

At a merging portion of the source gas supply flow path 30 and the diluent gas supply flow path 40, a gas mixer 50 is provided. The gas mixer 50 mixes the source gas flowing through the source gas supply flow path 30 with the diluent gas flowing through the diluent gas supply flow path 40 via the Venturi effect. Thus, the source gas flowing upstream of the merging portion in the source gas supply flow path 30 is drawn into the merging portion by the Venturi effect. This enables the source gas to be efficiently transported to the film forming part 70, and enables the source gas to be stably supplied to the film forming part 70. In addition, since it is possible to suppress the backflow of the diluent gas to the source gas supply flow path 30, it is possible to reduce the flow rate of the carrier gas. Therefore, a mass flow meter having a full scale (maximum flow rate) smaller than that of a conventional one may be used as the MFM 32. As a result, a ratio of the raw material to the full scale of the mass flow meter becomes larger than that of conventional one, and thus the measurement accuracy of the source gas flow rate measured by the MFM 32 is improved. The Venturi effect is a phenomenon in which a portion having a low pressure is generated when the cross-sectional area of a fluid flow is narrowed to increase the flow velocity. The gas mixer 50 may be, for example, a Venturi tube.

Figure 2:
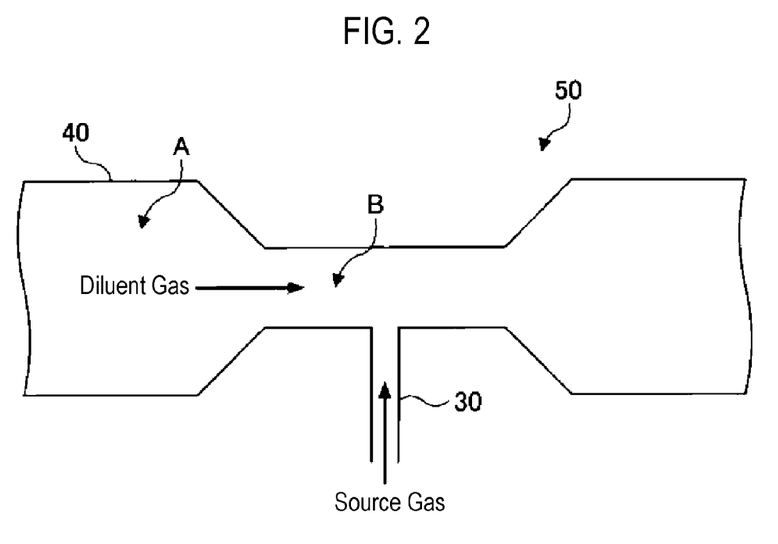
FIG. 2 is a detailed view illustrating a gas mixer using a Venturi tube.

FIG. 2 is a view illustrating the gas mixer 50 using a Venturi tube in detail, and is a schematic view for explaining the Venturi effect. As illustrated in FIG. 2, an operation, which is performed based on a differential pressure $\Delta P$ between a fluid pressure PA at an upstream side A of the Venturi tube, which is a location having a large cross-sectional area of the flow path, and a pressure PB at a throat portion B of the Venturi tube, which is a location having a narrow and small cross-sectional area of the flow path, will be described. It is assumed that a flow velocity at the upstream side A of the Venturi tube is referred to as UA and a flow velocity at the throat portion B of the Venturi tube is referred to as UB.

The relationship between the flow velocity UB of the fluid passing through the tube throat B of the Venturi tube and the differential pressure $\Delta P$ will be described. Assuming that the compressibility of the fluid is negligible and that there is no height difference in the flow path, no external work, and no friction loss, the total pressure P0 of the fluid is represented as the sum of dynamic pressure P1 and static pressure P2 as expressed by the following equation (1).

$$P0=P1+P2 \quad (1)$$

Here, the dynamic pressure P1 is expressed by the following equation (2) using fluid density $\rho$ and flow velocity U, and is proportional to the square of the flow velocity U.

$$P1=\rho \times U^2/2 \quad (2)$$

Accordingly, when the flow velocity U is small, the total pressure P0 becomes almost equal to the static pressure P2, and the relationship between the total pressure P0 and the static pressure P2 satisfies the following equation (3).

$$P0 \approx P2 \quad (3)$$

Meanwhile, when the flow velocity U increases, the dynamic pressure P1 increases, and the static pressure P2 decreases. Since the dynamic pressure P1 is proportional to the square of the flow velocity U, the dynamic pressure P1 tends to increase at an accelerated pace when the flow velocity U increases.

Since the flow velocity UA is small at the upstream side A of the Venturi tube, the static pressure P2A is almost equal to the total pressure P0A, and the influence of a change in the flow velocity is also small. In contrast, at the throat portion B of the Venturi tube, the flow velocity UB is large, and under the condition of the total pressure P0B=P0A, the static pressure P2B decreases as the dynamic pressure P1B increases. Moreover, the influence of a change in the flow velocity is also large. That is, the relations of the flowing equations (4) and (5) are satisfied.

$$P2A \approx P0A \quad (4)$$

$$P2B=P0B-P1B=P0A-P1B \approx P2A-\rho(UB)^2/2 \quad (5)$$

Accordingly, the static pressure difference $\Delta P2$ between the upstream side A of the Venturi tube and the throat portion B of the Venturi tube is expressed by the following equation (6).

$$\Delta P2=P2A-P2B \approx \rho(UB)^2/2 \quad (6)$$

Thus, the static pressure difference $\Delta P2$ between the upstream side A of the Venturi tube and the throat portion B of the Venturi tube may be approximated by a function of the flow velocity UB at the throat portion B of the Venturi tube. In other words, it is possible to derive the flow velocity UB from the value of the static pressure difference $\Delta P2$. Thus, since there is a correlation between the flow velocity UB at the throat portion B of the Venturi tube and the static pressure difference ΔP2, it is possible to control the flow velocity UB at the throat portion B of the Venturi tube to a predetermined flow velocity by controlling the static pressure difference ΔP2 at both portions to a predetermined value.

In addition, the cross-sectional area of the diluent gas supply flow path 40 is preferably larger than the cross-sectional area of the source gas supply flow path 30. This enables the back diffusion suppression effect to be enhanced in a self-aligned manner, and enables the source gas to be stably supplied into the processing container 72. Furthermore, the back diffusion suppression effect enables the adjustment of the flow rate of the source gas in a wider range.

A bypass pipe 60 is provided to connect a position between the valve V21 and the valve V22 in the carrier gas supply flow path 20 with a position between the valve V31 and the valve V32 in the source gas supply flow path 30. The bypass pipe 60 is a flow path for supplying the carrier gas, which is supplied from the carrier gas supply source 22 to the carrier gas supply flow path 20, to the source gas supply flow path 30 without passing through the raw material container 12. A valve V61 is installed in the bypass pipe 60. By closing the valves V22 and V31 and opening the valves V21, V61, and V32, the carrier gas, supplied from the carrier gas supply source 22, is supplied to the source gas supply flow path 30 via the carrier gas supply flow path 20 and the bypass pipe 60. This enables the source gas supply flow path 30 to be purged. In addition, the MFM 32 may be calibrated in order to minimize a deviation in flow rate measurement value with the MFC 24. Furthermore, by measuring the difference between the case of passing the raw material container 12 and the case of not passing the raw material container 12, it is possible to measure the supply amount of the source gas with high accuracy.

The film forming part 70 includes a processing container 72, a placement stage 74, and a gas introduction part 76. The processing container 72 is a vacuum container, the interior of which is capable of being decompressed. The placement stage 74 is provided in the processing container 72. The placement stage 74 supports and holds a wafer W to be a horizontal posture. The placement stage 74 includes a heater 74a. The wafer W is heated to a predetermined temperature by the heater 74a. The gas introduction part 76 introduces a source gas or the like into the processing container 72. A gas supply flow path 78 is connected to the gas introduction part 76, and the gas, which is supplied from the source gas supply apparatus 10, is supplied into the processing container 72 via the gas introduction part 76. An exhaust mechanism 82 is connected to the processing container 72 via an exhaust pipe 80. In the exhaust pipe 80, a pressure adjustment part 84, which adjusts the pressure in the processing container 72, is installed. The pressure adjustment part 84 includes, for example, a pressure adjustment valve 84a and a valve 84b.

In addition, each of a reducing gas supply flow path 90 and a purge gas supply flow path 100 joins the gas supply flow path 78.

The reducing gas supply flow path 90 supplies a reducing gas for reducing the source gas into the processing container 72. The reducing gas may be, for example, a hydrogen ($H_2$) gas. In an upstream end of the reducing gas supply flow path 90, a reducing gas supply source 92 as a supply source of the reducing gas is installed. In addition, an inert gas supply flow path 94 joins the reducing gas supply flow path 90. In an upstream end of the inert gas supply flow path 94, an inert gas supply source 96 as a supply source for supplying an inert gas is installed. The inert gas may be, for example, a nitrogen ($N_2$) gas. In the reducing gas supply flow path 90, a valve V91 and a valve V92 are installed in this order from the upstream side thereof. In the inert gas supply flow path 94, a valve V94 is installed.

The purge gas supply flow path 100 supplies a purge gas. The purge gas may be, for example, an inert gas such as a $N_2$ gas. In an upstream end of the purge gas supply flow path 100, a purge gas supply source 102 as a supply source of the purge gas is installed. In the purge gas supply flow path 100, a valve V100 is installed.

The controller 110 controls the operation of each part of the source gas supply apparatus 10, for example, the opening/closing operations of the valves V21, V22, V31, V32, V33, V41, and V61, and the operations of the MFC 24 and the MFC 44. In addition, the controller 110 controls the operation of each part of the film forming part 70, for example, the opening/closing operations of the valves V91, V92, V94, and V100, and the operation of the pressure adjustment part 84.

In an embodiment, the controller 110 controls the flow rate of the carrier gas such that the vaporization amount of the raw material, which is obtained by subtracting the flow rate of the carrier gas from the flow rate of the source gas, becomes equal to the set value of the vaporization amount of the raw material. The flow rate of the source gas is, for example, an integral value obtained by integrating the flow rate measurement value measured by the MFM 32 with respect to the supply period of the source gas. The flow rate of the carrier gas is, for example, an integral value obtained by integrating the flow rate measurement value measured by the MFC 24 with respect to the supply period.

Figure 3A:
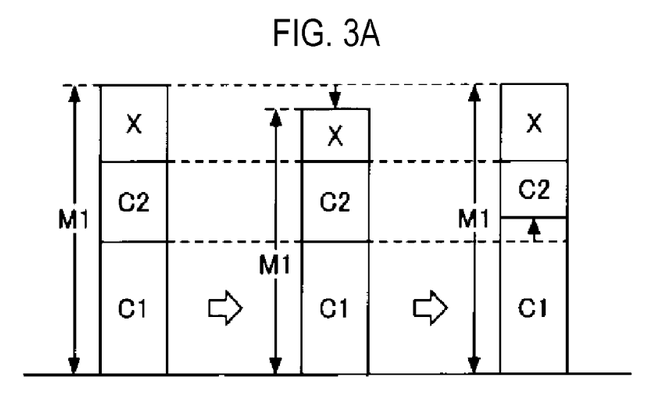
FIGS. 3A and 3B are schematic views for explaining gas flow rate control.
Figure 3B:
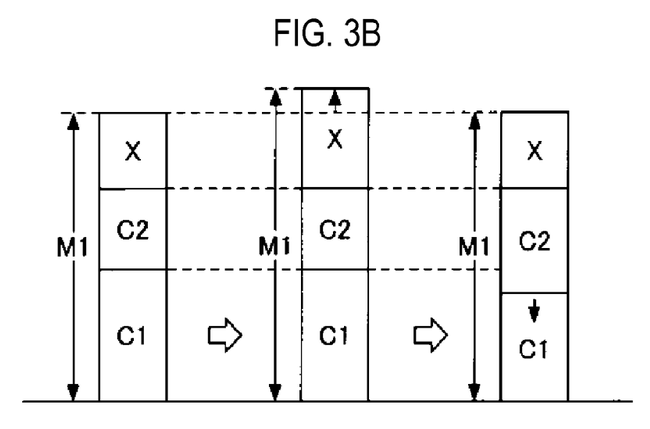

An example of gas supply by the controller 110 will be described with reference to FIGS. 3A and 3B. FIGS. 3A and 3B are schematic views for explaining gas flow rate control.

The left end of FIG. 3A represents a state in which a vaporization amount X of a raw material contained in the source gas in a certain supply period is a set value, and a correction value held by the controller 110 is zero. Here, as represented in the center of FIG. 3A, for example, if the vaporization amount X obtained in the $n^{th}$ supply period becomes smaller than the set value, a correction value corresponding to the difference between the vaporization amount X and the set value is output from the controller 110 in the $(n+1)^{th}$ supply period. Therefore, a set value of the flow rate C1 of the carrier gas increases depending on the decreased amount of the vaporization amount X, and the flow rate C1 is controlled to increase.

When the flow rate C1 of the carrier gas increases, the total flow rate M1 of the flow rate C1, the vaporization amount X of the raw material, and the flow rate C2 of the diluent gas become larger than the total flow rate M1 when the vaporization amount X is the set value. For this reason, a set value of the flow rate C2 of the diluent gas decreases by the correction value, whereby the flow rate C2 of the diluent gas is controlled by the controller 110 to decrease by an amount corresponding to the increased amount of the flow rate C1 of the carrier gas. As a result, as represented at the right end of FIG. 3A, the total flow rate M1 of the flow rate of the carrier gas flow rate C1, the vaporization amount X of the raw material, and the diluent gas flow rate C2 does not substantially fluctuate.

Further, as represented in the center of FIG. 3B, for example, if the vaporization amount X obtained in the $n^{th}$ supply period becomes larger than the set value, a set value of the flow rate C1 of the carrier gas decreases depending on the increased amount of the vaporization amount X, and the flow rate C1 is controlled to decrease. When the flow rate C1 of the carrier gas decreases, the total flow rate M1 of the flow rate C1, the vaporization amount X of the raw material, and the flow rate C2 of the diluent gas become smaller than the total flow rate M1 when the vaporization amount X is the set value. For this reason, a set value of the flow rate C2 of the diluent gas increases by the correction value, whereby the flow rate C2 of the diluent gas is controlled by the controller 110 to increase by an amount corresponding to the decreased amount of the flow rate C1 of the carrier gas. Even in this case, as represented at the right end of FIG. 3B, the total flow rate M1 does not substantially fluctuate. Thus, the vaporization amount X of the raw material is stabilized and the fluctuation of the total flow rate M1 is suppressed, so that it is possible to accurately adjust the vaporization flow rate of the raw material contained in the source gas.

The controller 110 may be, for example, a computer. A computer program for performing the operation of each part of the film forming apparatus is stored in a storage medium. The storage medium may be, for example, a flexible disk, a compact disk, a hard disk, a flash memory, or a DVD. In the embodiment, although the case in which the controller 110 controls the operation of each part of source gas supply apparatus 10 and the film forming part 70 has been described, the present disclosure is not limited thereto. The controller 110 may control, for example, only the operation of each part of the source gas supply apparatus 10. In this case, in addition to the controller 110, a controller that controls the operation of each part of the film forming part 70 is provided.

[Source Gas Supply Method]

Figure 4:
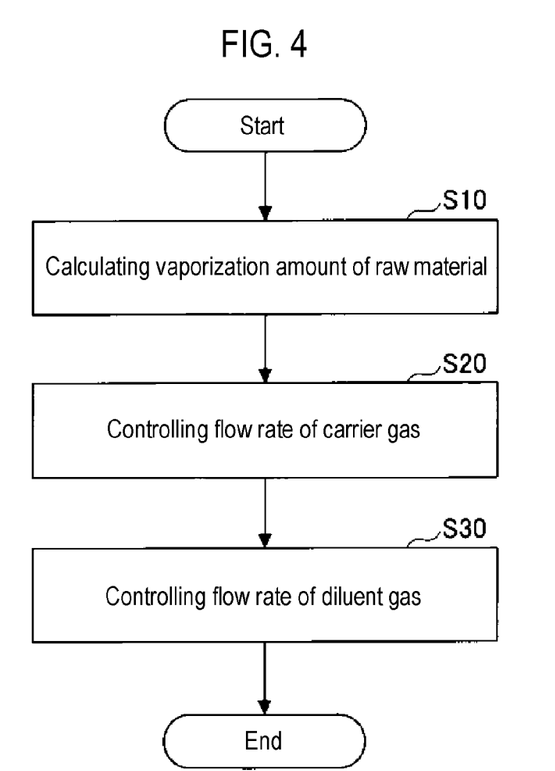
FIG. 4 is a flowchart illustrating an exemplary source gas supply method.

A source gas supply method according to an embodiment will be described by taking the case in which the source gas is supplied into the processing container 72 using the film forming apparatus illustrated in FIG. 1. The source gas supply method of the embodiment is executed by controlling the operation of each part of the film forming apparatus by the controller 110. FIG. 4 is a flowchart illustrating an exemplary source gas supply method. The source gas supply method is always performed, for example, while the source gas is being supplied into the processing container 72.

As illustrated in FIG. 4, the source gas supply method according to the embodiment includes a step of calculating a vaporization amount of a raw material (S10), a step of controlling a flow rate of a carrier gas (S20), and a step of controlling a flow rate of a diluent gas (S30).

The step of calculating the vaporization amount of the raw material (S10) is a step of calculating the amount of the raw material vaporized in the raw material container 12. In an embodiment, first, a carrier gas (for example, $N_2$ gas) is supplied to the raw material container 12, a source gas containing a vaporized raw material (for example, $WCl_6$) is mixed with a diluent gas (for example, $N_2$ gas) by the Venturi effect, and then the mixed source gas is supplied into the processing container 72. When a solid or liquid raw material is vaporized and supplied into the processing container 72, the vaporized raw material has a very small flow rate compared with the carrier gas or the diluent gas (for example, about several %). As an example, the flow rate of the carrier gas is 100 sccm to 1500 sccm, the flow rate of the diluent gas is 1000 sccm to 6000 sccm, and the flow rate of the vaporized raw material is 10 sccm to 30 sccm. In addition, the source gas and the diluent gas may be temporarily stored in the buffer tank 34 and intermittently supplied into the processing container 72 by intermittently opening and closing the valve V33.

In addition, in a state in which the source gas is being supplied, the flow rate of the source gas is measured by the MFM 32, and the flow rate of the carrier gas is measured by the MFC 24. Then, the vaporization amount of the raw material is calculated by subtracting the flow rate of the carrier gas measured by the MFC 24 (hereinafter, referred to as a "carrier gas flow rate") from the flow rate of the source gas measured by the MFM 32 (hereinafter, referred to as a "source gas flow rate"). At this time, the gas flowing through the MFM 32 is a mixture gas (source gas) of the carrier gas and the vaporized raw material flowing with the carrier gas. In other words, the gas flowing through the MFM 32 is the source gas of a relatively small flow rate before being mixed with the diluent gas. Therefore, as the MFM 32, instead of a mass flow meter having a full scale capable of measuring the total flow rate of the source gas and the diluent gas, a mass flow meter, which has a full scale smaller than that of a conventional one and is capable of measuring the flow rate of the source gas, may be used. As a result, the ratio of the raw material to the full scale of the mass flow meter becomes larger, and thus the measurement accuracy of the source gas flow rate by the MFM 32 is improved. In contrast, when the mass flow meter is installed after mixing the source gas and the diluent gas, it is necessary to use a mass flow meter having a full scale capable of measuring the total flow rate of the source gas and the diluent gas. Therefore, the ratio of the raw material to the full scale of the mass flow meter decreases, and thus the measurement accuracy of the source gas flow rate by the mass flow meter is degraded.

When the amount of diluent gas is small, the diluent gas supply flow path 40 has a low pressure and the carrier gas supply flow path 20 has a high pressure. Therefore, the back diffusion suppression effect is enhanced, and it is possible to stably supply the source gas towards the processing container 72. In contrast, when the amount of the diluent gas is large, the diluent gas supply flow path 40 becomes a high pressure, and the carrier gas supply flow path 20 becomes a low pressure. However, the diluent gas is capable of normally flowing without back diffusion due to the drawing-in effect by the Venturi effect. In this way, the back diffusion suppression effect by the Venturi effect makes it possible to adjust the flow rate of the source gas in a wider range.

The step of controlling the carrier gas flow rate (S20) is a step of controlling the flow rate of the carrier gas supplied to the carrier gas supply flow path 20 based on the vaporization amount of the raw material calculated in the step of calculating the vaporization amount of the raw material (S10). In the embodiment, the controller 110 controls the MFC 24 such that the vaporization amount of the raw material calculated in the step of calculating the vaporization amount of the raw material (S10) becomes equal to a predetermined set value determined in advance based on a process recipe or the like.

The step of controlling the diluent gas flow rate (S30) is a step of controlling the flow rate of the diluent gas supplied to the diluent gas supply flow path 40 such that the total flow rate of the carrier gas and the diluent gas becomes constant. In an embodiment, the controller 110 controls the MFC 44 based on the source gas flow rate measured by the MFM 32 and the diluent gas flow rate measured by the MFC 44 such that the total flow rate of the source gas flow rate and the diluent gas flow rate becomes constant. As a result, since the total flow rate of the gas supplied into the processing container 72 and the state of the gas temporarily stored in the buffer tank 34 do not change, it is possible to prevent the process environment (e.g., the pressure) in the processing container 72 from being changed.

Reference Example

Figure 5:
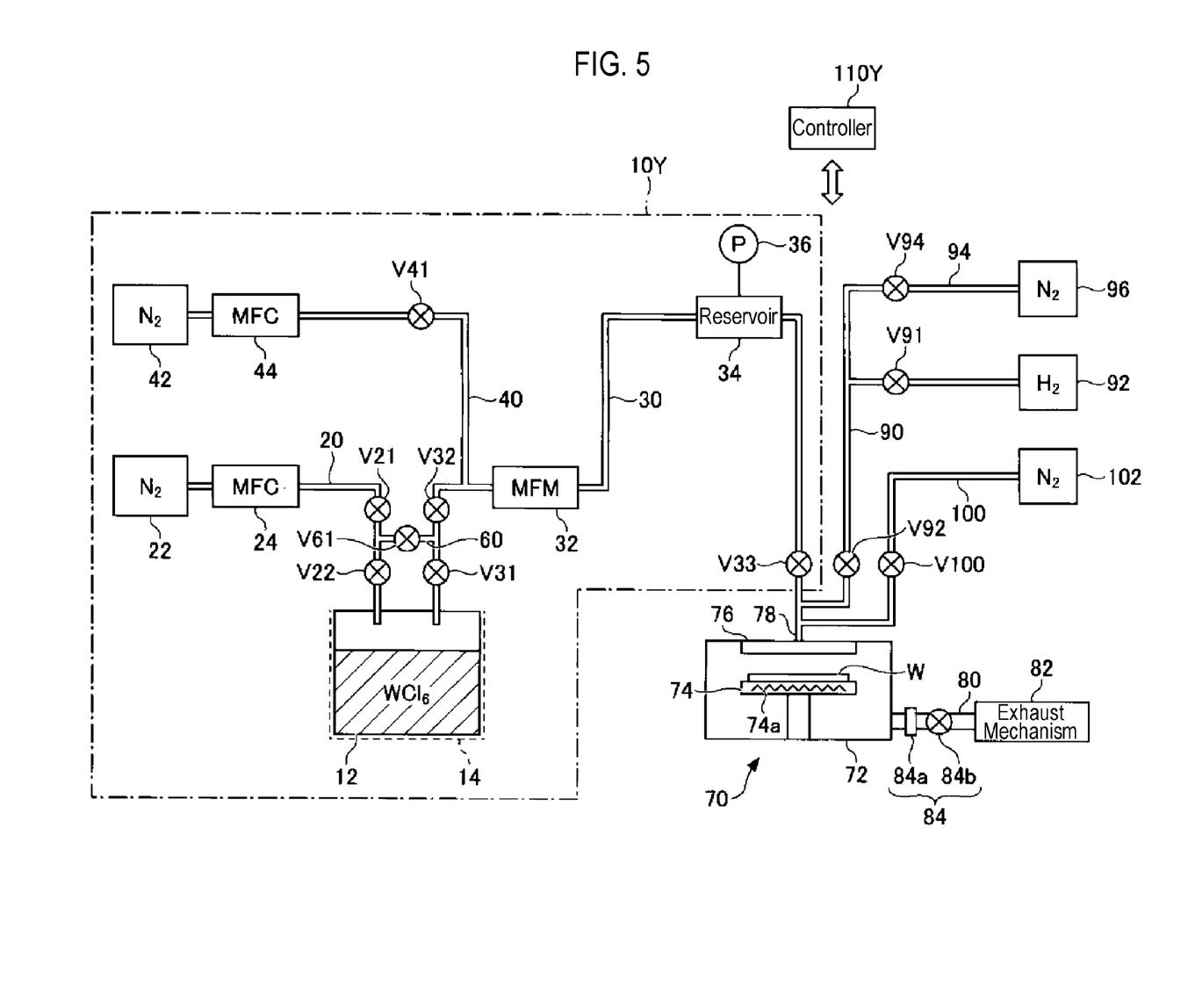
FIG. 5 is a view illustrating an exemplary configuration of a film forming apparatus including a source gas supply apparatus according to a reference example.

An exemplary configuration, in which a source gas supply apparatus of a reference example is applied to a film forming apparatus, will be described. FIG. 5 is a view illustrating an exemplary configuration of a film forming apparatus including the source gas supply apparatus according to the reference example.

The source gas supply apparatus 10Y of the reference example illustrated in FIG. 5 differs from the source gas supply apparatus 10 of the embodiment illustrated in FIG. 1 in that the diluent gas supply flow path 40 joins the upstream side of the MFM 32 in the source gas supply flow path 30 and the gas mixer 50 is not installed at the merging portion.

In the source gas supply apparatus 10Y, the controller 110Y controls the flow rate of the carrier gas such that the vaporization amount of the raw material, which is obtained by subtracting the total flow rate of the carrier gas and the diluent gas from the total flow rate of the source gas and the diluent gas, is equal to the set value of the vaporization amount of the raw material. The total flow rate of the source gas and the diluent gas is, for example, an integral value obtained by integrating the flow rate measurement value measured by the MFM 32 with respect to the supply period of the source gas. The flow rate of the carrier gas is, for example, an integral value obtained by integrating the flow rate measurement value measured by the MFC 24 with respect to the supply period. The flow rate of the diluent gas is an integral value obtained by integrating the flow rate measurement value measured by the MFC 44 with respect to the supply period.

In the source gas supply apparatus 10Y, when the source gas is temporarily stored in the buffer tank 34 and the required source gas is supplied in a short time, it is required to make the interior of the buffer tank 34 have a high pressure in a short time. Therefore, relatively large flow rates of gases, for example, 1500 sccm of a carrier gas and 4500 sccm of a diluent gas are supplied. In this case, as the MFM 32, a mass flow meter having a full scale, for example, 7000 ccm, capable of measuring the total flow rate of the carrier gas and the diluent gas, is used. However, since the vaporization amount of the raw material is a relatively small flow rate, for example, 30 sccm, the ratio of the vaporization amount (30 sccm) of the raw material to the full scale (7000 ccm) of the MFM 32 is 0.4% and thus very small. Therefore, it is difficult to accurately measure the vaporization amount of the raw material. The source gas supply apparatus 10 of the embodiment was made in consideration of this problem. In the source gas supply apparatus 10, the diluent gas supply flow path 40 joins the downstream side of the MFM 32 in the source gas supply flow path 30, and the gas mixer 50 is provided in the merging portion to mix the source gas with the diluent gas via the Venturi effect. This makes it possible to stably supply the source gas and to monitor the raw material with high accuracy.

[Source Gas Monitoring Accuracy]

Figure 6:
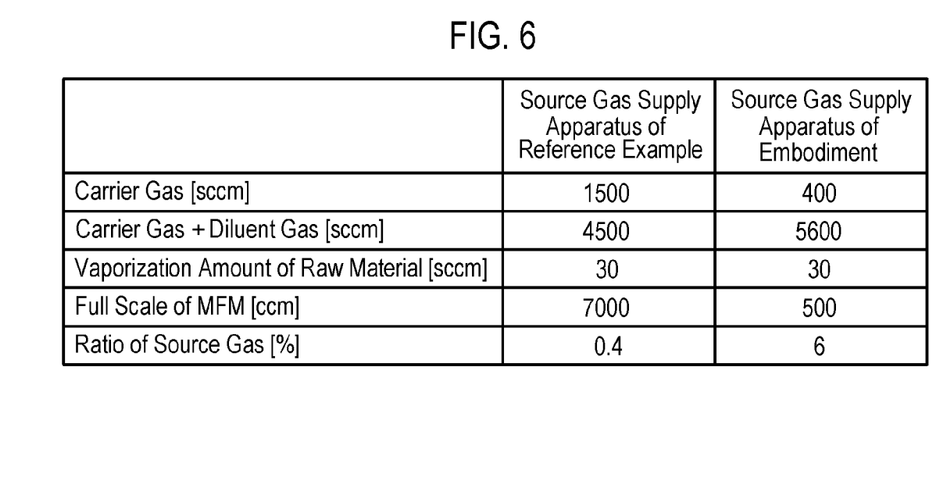
FIG. 6 is view showing an example of gas supply.
Figure 7:
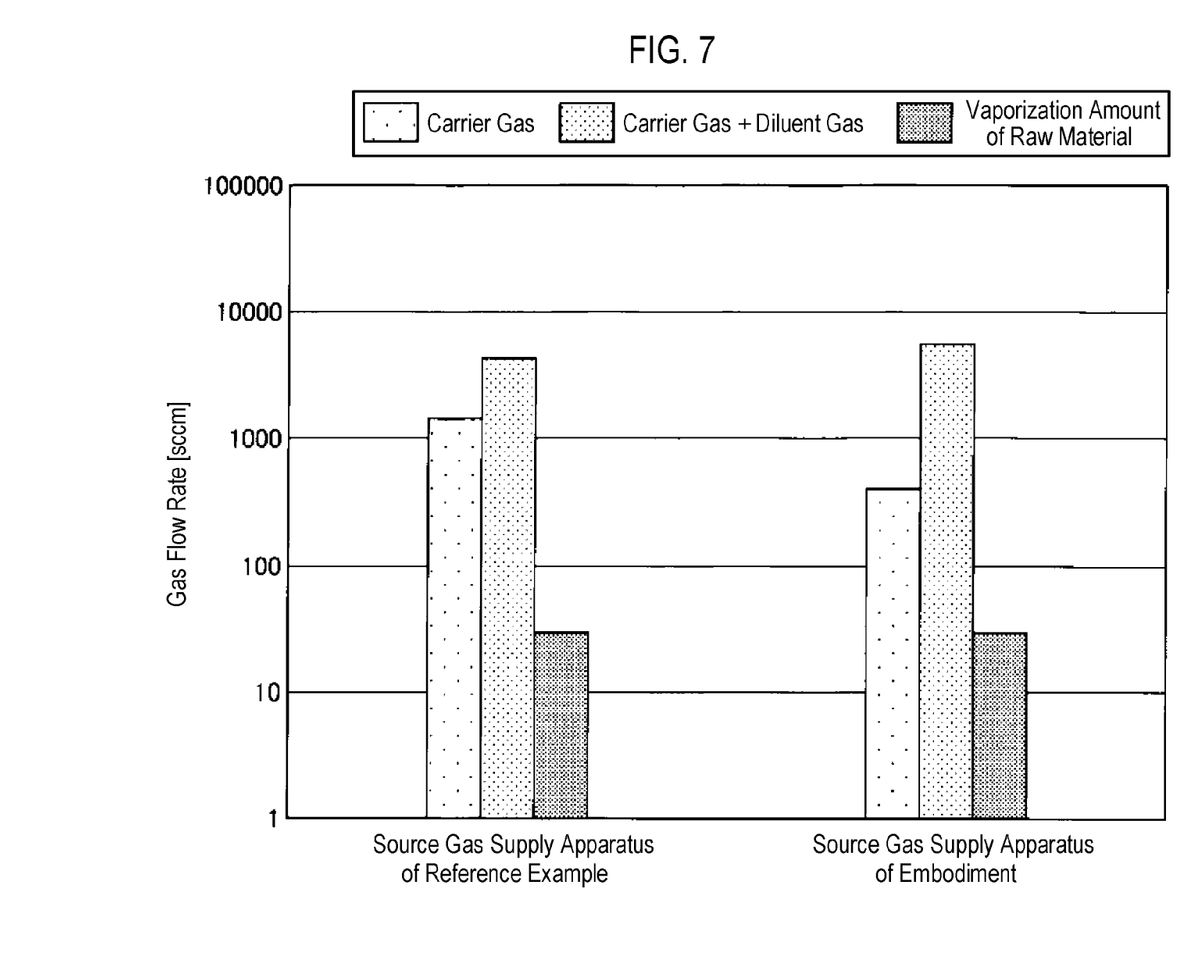
FIG. 7 is a graph representing exemplary gas flow rates.
Figure 8:
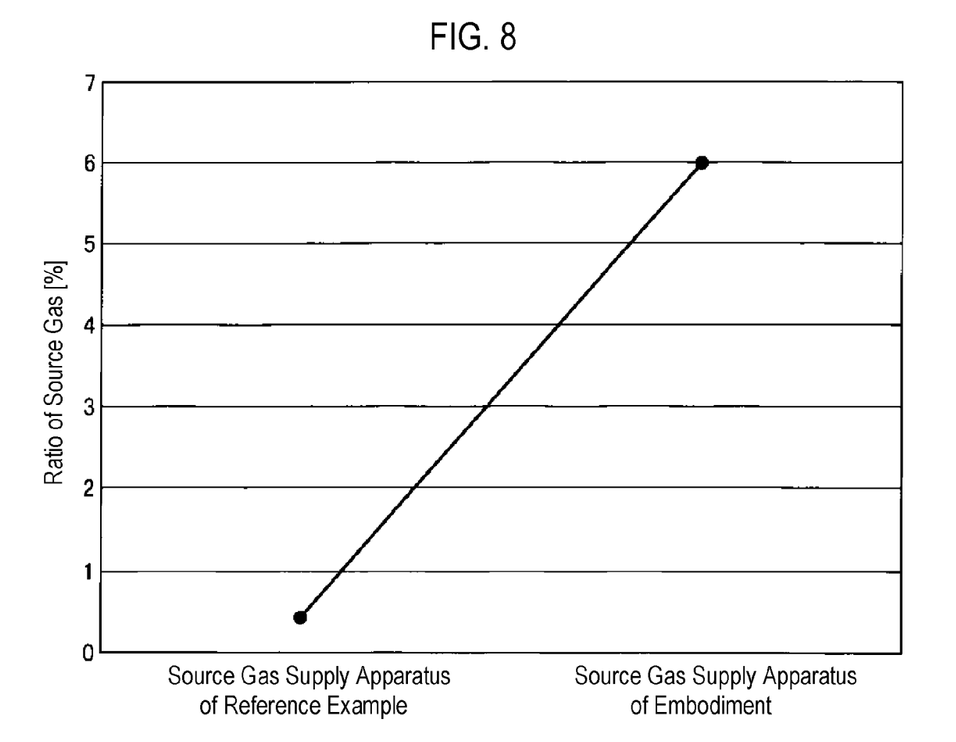
FIG. 8 is a graph representing an exemplary source gas ratio.

The monitoring accuracy of the source gas when using the source gas supply apparatus 10 of the embodiment will be described in comparison with the monitoring accuracy of the source gas when using the source gas supply apparatus 10Y of the reference example. FIG. 6 is a view representing exemplary gas supplies, illustrating gas flow rates and the vaporization amounts of the raw materials to the full scale of the MFM 32 (which may also be referred to as a "source gas ratio" below) when the gas supply is performed using each of the source gas supply apparatus 10Y of the reference example and the source gas supply apparatus 10 of the embodiment. FIG. 7 is a graph representing exemplary gas flow rates, and is a graph representing, in comparison, the gas flow rates (sccm) when the gas supply is performed using each of the source gas supply apparatus 10Y of the reference example and the source gas supply apparatus 10 of the embodiment. FIG. 8 represents an exemplary source gas ratio, and is a graph representing, in comparison, the source gas ratios (%) when the gas supply is performed using each of the source gas supply apparatus 10Y of the reference example and the source gas supply apparatus 10 of the embodiment.

As represented in FIGS. 6 and 7, when the source gas supply apparatus 10Y of the reference example is used, the flow rate of the carrier gas, the total flow rate of the carrier gas and the diluent gas, and the vaporization amount of the raw material may be set to, for example, 1500 sccm, 4500 sccm, and 30 sccm, respectively. In this case, as the MFM 32, a mass flow meter having a full scale (e.g., 7000 ccm) capable of measuring the total flow rate of the carrier gas, the diluent gas, and the vaporization amount of the raw material is used. Therefore, as represented in FIGS. 6 and 8, the source gas ratio becomes 0.4%.

Meanwhile, as represented in FIGS. 6 and 7, when the source gas supply apparatus 10 of the embodiment is used, the flow rate of the carrier gas, the total flow rate of the carrier gas and the diluent gas, and the vaporization amount of the raw material may be set to, for example, 400 sccm, 5600 sccm, and 30 sccm, respectively. In this case, as the MFM 32, a mass flow meter having a full scale (e.g., 500 ccm) capable of measuring the total flow rate of the carrier gas and the vaporization amount of the raw material may be used. Therefore, as represented in FIGS. 6 and 8, the source gas ratio becomes 6%.

From the above, by supplying the source gas using the source gas supply apparatus 10 of the embodiment, it is possible to increase the source gas ratio to be higher by one digit or more than that in the case in which the source gas is supplied using the source gas supply apparatus 10Y of the reference example. As a result, since the measurement accuracy of the vaporization amount of the raw material by the MFM 32 is improved, it is possible to supply a small flow rate of the source gas into the processing container 72 with high accuracy.

As described above, in the source gas supply apparatus 10, the diluent gas supply flow path 40 joins the downstream side of the MFM 32 in the source gas supply flow path 30, and the gas mixer is installed in the merging portion to mix the source gas with the diluent gas via the Venturi effect. Thus, the source gas flowing upstream of the merging portion of the source gas supply flow path 30 is drawn into the merging portion due to the Venturi effect. This enables the source gas to be efficiently transported to the film forming part 70, and enables the source gas to be stably supplied to the film forming part 70. In addition, since it is possible to suppress the backflow of the diluent gas to the source gas supply flow path 30, it is possible to reduce the flow rate of the carrier gas. Therefore, a mass flow meter having a full scale (maximum flow rate) smaller than that of a conventional one may be used as the MFM 32. As a result, the ratio of the raw material to the full scale of the mass flow meter becomes larger than that of a conventional one, and thus the measurement accuracy of the source gas flow rate measured by the MFM 32 is improved.

According to the present disclosure, it is possible to stably supply a source gas at a small flow rate with high accuracy.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A source gas supply apparatus that supplies a source gas into a processing container, the source gas supply apparatus comprising:
a raw material container configured to contain a solid or liquid raw material, and to vaporize the raw material;
a source gas supply flow path configured to supply the source gas including the raw material vaporized in the raw material container into the processing container;
a flow rate measurement part installed in the source gas supply flow path, and configured to measure a flow rate of the source gas;
a diluent gas supply flow path joining a downstream side of the flow rate measurement part in the source gas supply flow path, and configured to supply a diluent gas for diluting the source gas;
a gas mixer provided at a merging portion of the source gas supply flow path and the diluent gas supply flow path, and configured to mix the source gas with the diluent gas via a Venturi effect;
a carrier gas supply flow path configured to supply a carrier gas, which is an inert gas, to the raw material container; and
a controller configured to control a flow rate of the carrier gas supplied to the carrier gas supply flow path based on a vaporization amount of the raw material obtained by subtracting the flow rate of the carrier gas flowing through the carrier gas supply flow path from the flow rate of the source gas measured by the flow rate measurement part,
wherein a flow rate of the diluent gas supplied to the diluent gas supply flow path is larger than the flow rate of the carrier gas supplied to the carrier gas supply flow path.

2. The source gas supply apparatus of claim 1, wherein the controller is further configured to control the flow rate of the carrier gas such that the vaporization amount of the raw material is equal to a set value.

3. The source gas supply apparatus of claim 2, wherein the controller is further configured to control the flow rate of the diluent gas such that a total flow rate of the flow rate of the carrier gas and the flow rate of the diluent gas becomes constant.

4. The source gas supply apparatus of claim 3, further comprising:
a reservoir installed in a downstream side of the merging portion in the source gas supply flow path, and configured to store the source gas.

5. The source gas supply apparatus of claim 4, wherein the raw material is $WCl_6$.

6. The source gas supply apparatus of claim 1, wherein a cross-sectional area of the diluent gas supply flow path is larger than a cross-sectional area of the source gas supply flow path.

7. The source gas supply apparatus of claim 1, further comprising:
a reservoir installed in a downstream side of the merging portion in the source gas supply flow path, and configured to store the source gas.

8. The source gas supply apparatus of claim 1, wherein the raw material is $WCl_6$.

9. A film forming apparatus comprising:
a source gas supply apparatus configured to supply a source gas into a processing container; and
a film forming part installed in a downstream side of the source gas supply apparatus, and configured to form a film on a substrate using the source gas supplied from the source gas supply apparatus,
wherein the source gas supply apparatus includes:
a raw material container configured to contain a solid or liquid raw material, and to vaporize the raw material;
a source gas supply flow path configured to supply the source gas including the raw material vaporized in the raw material container into the processing container;
a flow rate measurement part installed in the source gas supply flow path, and configured to measure a flow rate of the source gas;
a diluent gas supply flow path joining a downstream side of the flow rate measurement part in the source gas supply flow path, and configured to supply a diluent gas for diluting the source gas;
a gas mixer provided at a merging portion of the source gas supply flow path and the diluent gas supply flow path, and configured to mix the source gas with the diluent gas via a Venturi effect;
a carrier gas supply flow path configured to supply a carrier gas, which is an inert gas, to the raw material container; and
a controller configured to control a flow rate of the carrier gas supplied to the carrier gas supply flow path based on a vaporization amount of the raw material obtained by subtracting the flow rate of the carrier gas flowing through the carrier gas supply flow path from the flow rate of the source gas measured by the flow rate measurement part,
wherein a flow rate of the diluent gas supplied to the diluent gas supply flow path is larger than the flow rate of the carrier gas supplied to the carrier gas supply flow path.

* * * * *